United States Patent
Tang

(10) Patent No.: US 12,086,527 B2
(45) Date of Patent: Sep. 10, 2024

(54) ELECTRICAL DESIGN RULE CHECKING METHOD AND DEVICE FOR INTEGRATED CIRCUIT

(71) Applicant: SPREADTRUM COMMUNICATIONS (SHANGHAI) CO., LTD., Shanghai (CN)

(72) Inventor: Yaquan Tang, Shanghai (CN)

(73) Assignee: SPREADTRUM COMMUNICATIONS (SHANGHAI) CO., LTD., Shanghai (CN)

( * ) Notice: Subject to any disclaimer, the term of this patent is extended or adjusted under 35 U.S.C. 154(b) by 543 days.

(21) Appl. No.: 17/426,612

(22) PCT Filed: Mar. 5, 2019

(86) PCT No.: PCT/CN2019/077021
§ 371 (c)(1),
(2) Date: Jul. 28, 2021

(87) PCT Pub. No.: WO2020/155290
PCT Pub. Date: Aug. 6, 2020

(65) Prior Publication Data
US 2022/0100946 A1    Mar. 31, 2022

(30) Foreign Application Priority Data
Jan. 28, 2019  (CN) .......................... 201910081729.9

(51) Int. Cl.
*G06F 30/398* (2020.01)
*G06F 30/323* (2020.01)
*G06F 30/392* (2020.01)

(52) U.S. Cl.
CPC .......... *G06F 30/398* (2020.01); *G06F 30/323* (2020.01); *G06F 30/392* (2020.01)

(58) Field of Classification Search
USPC ........................................................ 716/100
See application file for complete search history.

(56) References Cited

U.S. PATENT DOCUMENTS 8,667,450 B2 * 3/2014 Wang ................... G06F 30/398
                                                       716/136
9,223,912 B1   12/2015 Liapis et al.
(Continued)

FOREIGN PATENT DOCUMENTS

| CN | 102866349 A | 1/2013 |
| CN | 104933214 A | 9/2015 |
| CN | 109214023 A | 1/2019 |

OTHER PUBLICATIONS

The State Intellectual Property Office of People's Republic of China, First Office Action, Chinese Patent Application No. 201910081729.9, Mailed Sep. 3, 2021, 10 pages.
(Continued)

*Primary Examiner* — Mohammed Alam
(74) *Attorney, Agent, or Firm* — CHRISTENSEN O'CONNOR JOHNSON KINDNESS PLLC

(57) ABSTRACT

Provided are a method and a device for electrical DRC of an integrated circuit. The method includes: acquiring a parasitic parameter netlist of the integrated circuit; receiving a circuit simulation result of the integrated circuit and electrical DRC rules; and performing electrical DRC on the integrated circuit based on the parasitic parameter netlist, the circuit simulation result and the electrical DRC rules.

9 Claims, 3 Drawing Sheets

(56) References Cited

U.S. PATENT DOCUMENTS

| | | | |
|---|---|---|---|
| 9,436,795 B2 | 9/2016 | Onodera | |
| 9,684,750 B1* | 6/2017 | Bernard | G06F 30/30 |
| 2009/0187866 A1 | 7/2009 | Ou et al. | |
| 2013/0239077 A1* | 9/2013 | Wang | G06F 30/39 |
| | | | 716/111 |
| 2014/0032201 A1* | 1/2014 | McCombs | G06F 30/3312 |
| | | | 703/14 |
| 2017/0091371 A1* | 3/2017 | Lin | G06F 30/20 |
| 2017/0337314 A1* | 11/2017 | Anderson | G06F 30/327 |
| 2019/0034574 A1* | 1/2019 | Zhu | G06F 30/392 |
| 2022/0100946 A1* | 3/2022 | Tang | G06F 30/392 |

OTHER PUBLICATIONS

Intellectual Property India, Examination Report, Mar. 11, 2022, 6 pages.

International Search Report and Written Opinion, mailed Oct. 30, 2019, issued in corresponding International Application No. PCT/CN2019/077021, filed Mar. 5, 2019, 11 pages.

Extended European Search Report mailed Feb. 17, 2023, issued in corresponding European Application No. 19913417, filed Mar. 5, 2019, 10 pages.

Robert Fischbach et al., Design Rule Check and Layout versus Schematic for 3D Integration and Advanced Packaging, Fraunhofer Institute for Integrated Circuits IIS Design Automation Division EAS, 2014, pp. 1-7, Georgia Institute of Technology, Downloaded on Apr. 5, 2023, IEEE Xplore.

LV Jiangping et al., Layout Verification Technologies for SDSM Digital ICs, East China Institute of Photoelectric Integrated Device, Aug. 2017, pp. 16-20, vol. 17, No. 8, Suzhou China 215163.

* cited by examiner

ELECTRICAL DESIGN RULE CHECKING METHOD AND DEVICE FOR INTEGRATED CIRCUIT

CROSS-REFERENCE TO RELATED APPLICATIONS

This application is a national stage of International Application No. PCT/CN2019/077021, filed on Mar. 5, 2019, which claims priority to Chinese Patent Application No. 201910081729.9, filed on Jan. 28, 2019. All of the aforementioned applications are hereby incorporated by reference in their entireties.

TECHNICAL FIELD

The present disclosure relates to the technical field of physical verification for an integrated circuit (IC), and in particular, to a method and a device for electrical design rule check (DRC) of an integrated circuit.

BACKGROUND

After a layout design of an integrated circuit is completed, a physical verification shall be performed on the layout of the integrated circuit. Physical verification usually includes DRC, LVS (Layout Versus Schematic), ERC (Electrical Rule Check) and the like.

In the related art, during physical verification of an integrated circuit, since electrical DRC is performed by a physical design engineer who is familiar with electrical DRC but is unfamiliar with circuit design, it may easily cause false check and over-design. In addition, electrical DRC includes check of various electrical items, especially in advanced processes, the number of check items is increasing and the requirement is increasing, therefore, it is time-consuming, labor-intensive and extremely error-prone.

SUMMARY

In view of this, the present disclosure proposes a method and a device for electrical design rule check (DRC) of an integrated circuit.

In a first aspect of the present disclosure, a method for electrical DRC of an integrated circuit is provided. The method comprises: acquiring a parasitic parameter netlist of the integrated circuit; receiving a circuit simulation result of the integrated circuit and electrical DRC rules; and performing electrical DRC on the integrated circuit based on the parasitic parameter netlist, the circuit simulation result and the electrical DRC rules. In a second aspect of the present disclosure, a device for electrical DRC of an integrated circuit is provided. The device comprises: an acquisition module configured to acquire a parasitic parameter netlist of the integrated circuit; a reception module configured to receive a circuit simulation result of the integrated circuit and electrical DRC rules; and a check module configured to perform electrical DRC on the integrated circuit based on the parasitic parameter netlist, the circuit simulation result, and the electrical DRC rules.

According to following detailed description of exemplary embodiments with reference to accompanying drawings, other features and aspects of the present disclosure will become clear.

BRIEF DESCRIPTION OF DRAWINGS

Drawings included in the specification and constituting a part of the specification together with the specification illustrate exemplary embodiments, features, and aspects of the present disclosure, and are used to explain principle of the present disclosure.

DESCRIPTION OF EMBODIMENTS

Figure 1:
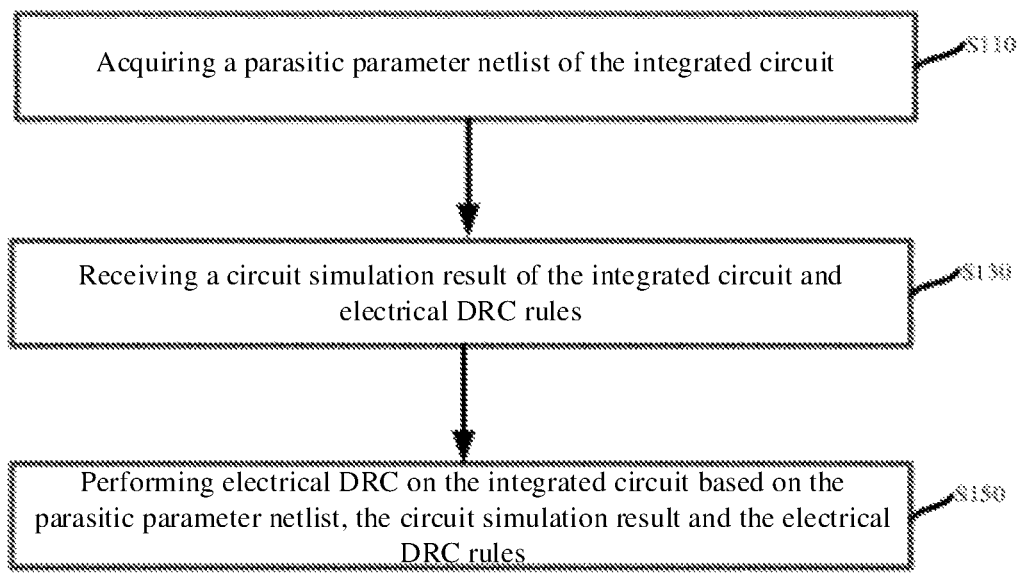
FIG. 1 is a flow chart illustrating a method for electrical DRC of an integrated circuit according to an exemplary embodiment.

Hereinafter, various exemplary embodiments, features, and aspects of the present disclosure will be described in detail with reference to the drawings. The same reference sign in the drawings indicates an element with same or similar function. Although various aspects of the embodiments are shown in the drawings, unless otherwise indicated, the drawings are not necessarily drawn to scale.

The dedicated expression "exemplary" herein means "serving as an example, embodiment, or illustration". Any embodiment described herein as "exemplary" is not necessarily be construed as being superior to or better than the other embodiments.

In addition, in order to better illustrate the present disclosure, numerous specific details are given in following specific embodiments. Those skilled in the art should understand that the present disclosure can also be implemented without certain specific details. In some examples, methods, means, elements, and circuits that are well known to those skilled in the art have not been described in detail in order to highlight a gist of the present disclosure.

FIG. 1 is a flow chart of a method for electrical DRC of an integrated circuit according to an exemplary embodiment. In a possible implementation, the method for electrical DRC according to the present disclosure may be applied to a reliability simulation platform, which can for example perform reliability analysis on the integrated circuit and determine a physical location where a reliability problem exists in the integrated circuit. Exemplarily, the reliability simulation platform is, for example, an existing transistor-level reliability simulation signoff platform. The reliability analysis on the integrated circuit includes, but is not limited to, reliability analysis of voltage-drop and electrical migration (EM) of a power supply and signal lines.

As shown in FIG. 1, a method for electrical DRC of an integrated circuit according to the present disclosure may include following steps.

In S110, a parasitic parameter netlist of the integrated circuit is acquired.

In this embodiment, the parasitic parameter netlist of the integrated circuit may be acquired by the following manners.

In a first manner, a circuit netlist of the integrated circuit and a layout of the integrated circuit are acquired, then the parasitic parameter netlist of the integrated circuit is acquired by performing a physical extraction on the circuit netlist of the integrated circuit and the layout of the integrated circuit.

In a second manner, a parasitic parameter of the integrated circuit is extracted by a parasitic parameter extraction tool or other software tools, an extraction result is acquired after the parasitic parameter extraction tool performs parasitic parameter extraction on the integrated circuit, and the extraction result is the parasitic parameter netlist.

In S130, a circuit simulation result of the integrated circuit and DRC rules are received.

In this embodiment, the circuit simulation result of the integrated circuit may be a result of circuit simulation for the integrated circuit by a simulation tool, and may include various simulation output results. Exemplarily, the circuit simulation result may be a wave file such as an FSDB file, a PSF file and the like, or a text file such as a PWL file, a CSV file, a VCD file and the like. Based on the circuit simulation result, a signal change amplitude on an input end of each element of the integrated circuit, a signal change amplitude on an output end of each element of the integrated circuit, and a signal change amplitude on each parasitic element within a predetermined time period can be determined. Therefore, the circuit simulation result is a dynamic check result.

Electrical DRC rules may include, but are not limited to, electrical rules stipulated by various chip manufacturers. Table 1 shows a table of electrical DRC rules according to an exemplary embodiment.

TABLE 1

Table of electrical DRC rules

| electrical DRC rule (Rule) | Description | Voltage drop (Delta-V) | Space |
|---|---|---|---|
| M2.S.2 | Space between M2 | NA | 0.032 |
| M2.S.18.0 | Space between M2 | >1.05 V + 10% | 0.042 |
| M2.S.18.1 | Space between M2 | >1.2 V + 10% | 0.045 |
| M2.S.18.2 | Space between M2 | >1.5 V + 10% | 0.051 |
| M2.S.18.3 | Space between M2 | >2.5 V + 10% | 0.069 |

It should be understood by those skilled in the art that M2.S.2, M2.S.18.0, M2.S.18.1, M2.S.18.2, and M2.S.18.3 in Table 1 represent identifiers of the electrical DRC rules. The expression "Space between M2" in Table 1 indicates a space between two metal lines in a second metal layer. Accordingly, the electrical DRC rule identified as M2.S.18.0 is as follows: a voltage drop between two metal lines in the second metal layer should be greater than (1.05V+10%), and a space between two metal lines should be 0.042.

In S150, based on the parasitic parameter netlist, the circuit simulation result and the electrical DRC rules, the electrical DRC is performed on the integrated circuit.

In this embodiment, the electrical DRC may be performed on the integrated circuit based on the parasitic parameter netlist, the circuit simulation result and the electrical DRC rules of the integrated circuit. In a possible implementation, whether the integrated circuit complies with the electrical DRC rules is determined based on the parasitic parameter netlist and the electrical DRC rules of the integrated circuit. If it is determined that the integrated circuit does not comply with the electrical DRC rules, it means that there is an error in the electrical DRC of the integrated circuit. Then, based on the circuit simulation result, a physical location in the integrated circuit that does not comply with the electrical DRC rule, i.e., the physical location in the integrated circuit where there is an error during the electrical DRC of the integrated circuit is determined. Conversely, if it is determined that the integrated circuit complies with the electrical DRC rules, it means that there is no error in the electrical DRC of the integrated circuit.

In the method for electrical DRC of the integrated circuit according to this embodiment, the parasitic parameter netlist of the integrated circuit is acquired and the circuit simulation result of the integrated circuit and the electrical DRC rules are received, then electrical DRC is performed on the integrated circuit based on the parasitic parameter netlist, the circuit simulation result and the electrical DRC rules of the integrated circuit. Therefore, dynamic electrical DRC can be automatically performed based only on the acquired parasitic parameter netlist, the received circuit simulation result and electrical DRC rules without requiring the operator to manually write the code, moreover, the physical location in the integrated circuit where an error occurs during the electrical DRC can be precisely determined, thereby significantly improving the speed and accuracy of electrical DRC, reducing false errors of electrical DRC, and avoiding over-design of integrated circuits.

Compared with the related art where operator performing electrical DRC is limited to a physical design engineer who is familiar with electrical DRC but not familiar with circuit design, the method for electrical DRC of the integrated circuit according to this embodiment can reduce the requirements for the familiarity of the electrical DRC by operators who perform electrical DRC. Therefore, the electrical DRC can be conducted by the design engineers who are familiar with circuit design, thereby greatly improving the design quality of the integrated circuit. Moreover, since both the circuits design and the electrical DRC are conducted by the design engineers who are familiar with circuit design, instead of having to perform electrical-related DRC by someone else who has not designed the circuit, the design process of ICs can be simplified and the design efficiency of ICs can be improved, enabling the ICs to be rapidly productized and meet the signoff standards.

In a possible implementation, the above-mentioned method for electrical DRC of the integrated circuit may further comprise: outputting a check result of the electrical DRC performed on the integrated circuit.

In this embodiment, after completing the electrical DRC of the integrated circuit, the check result may be outputted to the operator, so as to determine whether the integrated circuit complies with the electrical DRC rules.

Figure 2:
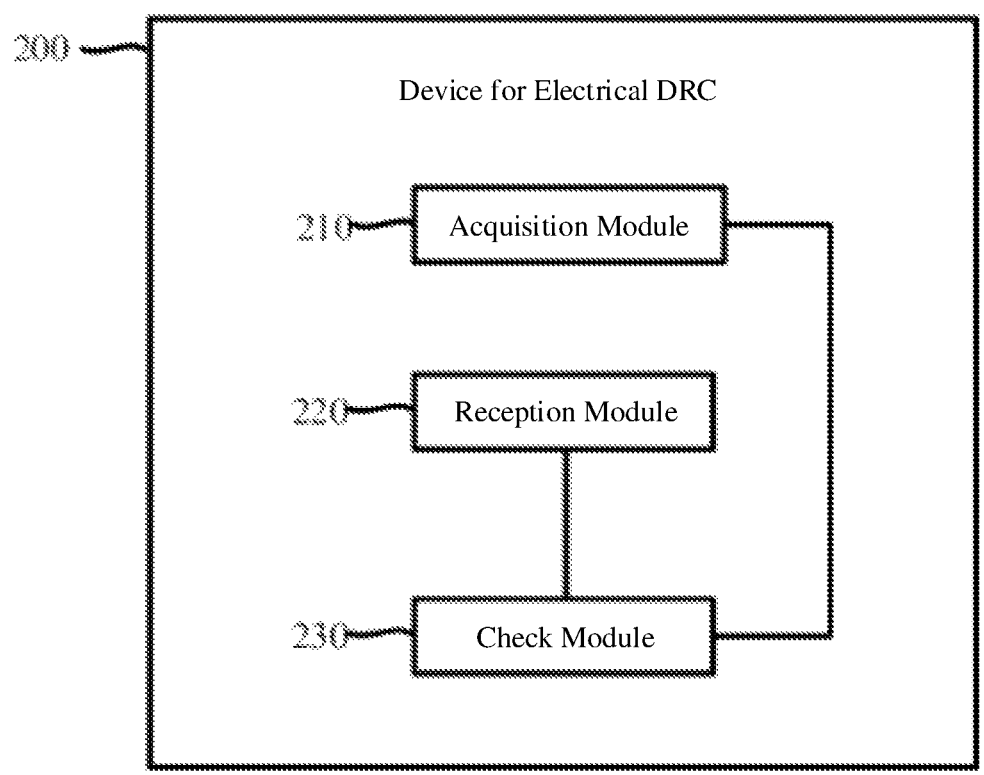
FIG. 2 is a block diagram of a device for electrical DRC of an integrated circuit according to an exemplary embodiment.

FIG. 2 is a block diagram of a device for electrical DRC of an integrated circuit according to an exemplary embodiment. As shown in FIG. 2, the device may comprise an acquisition module 210, a reception module 220, and a check module 230.

The acquisition module 210 is configured to acquire a parasitic parameter netlist of the integrated circuit.

The reception module 220 is configured to receive a circuit simulation result of the integrated circuit and electrical DRC rules.

The check module 230 is connected to the acquisition module 210 and the reception module 220, and is configured to perform electrical DRC on the integrated circuit based on the parasitic parameter netlist, the circuit simulation result, and the electrical DRC rules.

In a possible implementation, the reception module 220 is further configured to: receive a layout of the integrated circuit; and receive a circuit netlist of the integrated circuit.

The acquisition module 210 is configured to: acquire the parasitic parameter netlist by performing physically extraction on the circuit netlist and the layout of the integrated circuit.

In a possible implementation, the check module 230 is configured to: determine, based on the parasitic parameter netlist and the electrical DRC rules, whether the integrated circuit complies with the electrical DRC rules; and in response to determining that the integrated circuit does not comply with the electrical DRC rules, a physical location in the integrated circuit that does not comply with the electrical DRC rules is determined based on the circuit simulation result.

In a possible implementation, the above-mentioned device may further comprise an output module (not shown) configured to output a check result of the electrical DRC performed on the integrated circuit.

Regarding the device in the foregoing embodiments, the specific manners in which each module operates has been described in detail in the above-mentioned embodiments of the method, and thus will not be further described herein.

Figure 3:
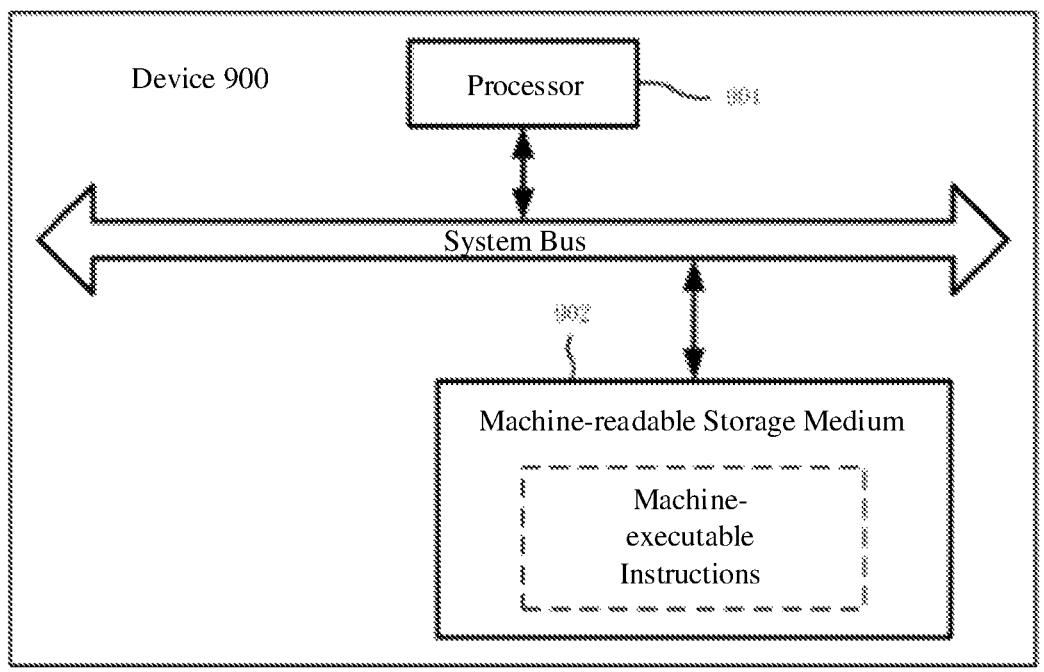
FIG. 3 is a block diagram of a hardware structure of a device for electrical DRC of an integrated circuit according to an exemplary embodiment.

FIG. 3 is a block diagram of a hardware structure of a device for electrical DRC of an integrated circuit according to an exemplary embodiment. Referring to FIG. 3, a device 900 may comprise a processor 901, and a machine-readable storage medium 902 having machine-executable instructions stored therein. The processor 901 may communicate with the machine-readable storage medium 902 via a system bus 903. In addition, the processor 901 may execute the above-mentioned method for electrical DRC of the integrated circuit by reading the machine-executable instructions corresponding to the logic for the electrical DRC of the integrated circuit in the machine-readable storage medium 902.

The machine-readable storage medium 902 mentioned herein may be any one of an electronic device, a magnetic device, an optical device, or other physical storage devices, and may contain or store information such as executable instructions, data, and so on. For example, the machine-readable storage medium may be a random access memory (RAM), a volatile memory, a non-volatile memory, a flash memory, a storage drive (e.g., a hard drive), a solid state drive, or any type of storage disks (e.g., CD, DVD, etc.), or similar storage medium, or a combination thereof.

The embodiments of the present disclosure have been described above, while the above description is exemplary only, but not exhaustive, and is not limited to the disclosed embodiments. Without departing from the scope and spirit of the described embodiments, those skilled in the art may make various modifications and changes. The choice of terms used herein is intended to best explain the principles of the various embodiments, practical applications, or technical improvements in the market, or to enable other ordinary skilled in the art to understand embodiments disclosed herein.

What is claimed is:

1. A method for electrical design rule check (DRC) of an integrated circuit, the method comprising:
   acquiring a parasitic parameter netlist of the integrated circuit;
   receiving a circuit simulation result of the integrated circuit and electrical DRC rules;
   determining, based on the parasitic parameter netlist and the electrical DRC rules of the integrated circuit, whether the integrated circuit complies with the electrical DRC rules, and
   determining, based on the circuit simulation result, a physical location in the integrated circuit that does not comply with the electrical DRC rules in response to determining that the integrated circuit does not comply with the electrical DRC rules.

2. The method according to claim 1, further comprising:
   receiving a layout of the integrated circuit; and
   receiving a circuit netlist of the integrated circuit,
   wherein said acquiring the parasitic parameter netlist of the integrated circuit comprises:
   acquiring the parasitic parameter netlist by performing physical extraction on the circuit netlist and the layout of the integrated circuit.

3. The method according to claim 1, further comprising:
   outputting a check result of the electrical DRC performed on the integrated circuit.

4. A device for electrical design rule check (DRC) of an integrated circuit, the device comprising:
   a memory; and
   at least one processor coupled to the memory and configured to:
   acquire a parasitic parameter netlist of the integrated circuit;
   receive a circuit simulation result of the integrated circuit and electrical DRC rules;
   determine, based on the parasitic parameter netlist and the electrical DRC rules of the integrated circuit, whether the integrated circuit complies with the electrical DRC rules, and
   determine, based on the circuit simulation result, a physical location in the integrated circuit that does not comply with the electrical DRC rules in response to determining that the integrated circuit does not comply with the electrical DRC rules.

5. The device according to claim 4, wherein the at least one processor is further configured to:
   receive a layout of the integrated circuit; and
   receive a circuit netlist of the integrated circuit,
   wherein said acquisition module is configured to acquire the parasitic parameter netlist by performing extraction on the circuit netlist and the layout of the integrated circuit.

6. The device according to claim 4, wherein the at least one processor is further configured to:
   output a check result of the electrical DRC performed on the integrated circuit.

7. A non-transitory storage medium having computer program instructions stored therein, wherein the computer program instructions, when executed by a processor, are configured to implement a method for electrical design rule check (DRC) of an integrated circuit, the method comprising:
   acquiring a parasitic parameter netlist of the integrated circuit;
   receiving a circuit simulation result of the integrated circuit and electrical DRC rules;
   determining, based on the parasitic parameter netlist and the electrical DRC rules of the integrated circuit, whether the integrated circuit complies with the electrical DRC rules, and
   determining, based on the circuit simulation result, a physical location in the integrated circuit that does not comply with the electrical DRC rules in response to determining that the integrated circuit does not comply with the electrical DRC rules.

8. The non-transitory storage medium according to claim 7, wherein the method comprises:
   receiving a layout of the integrated circuit; and
   receiving a circuit netlist of the integrated circuit,
   wherein said acquiring the parasitic parameter netlist of the integrated circuit comprises:
   acquiring the parasitic parameter netlist by performing physical extraction on the circuit netlist and the layout of the integrated circuit.

9. The non-transitory storage medium according to claim 7, wherein the method further comprises:

outputting a check result of the electrical DRC performed on the integrated circuit.

\* \* \* \* \*